United States Patent [19]

Choi

[11] Patent Number: 5,761,140
[45] Date of Patent: Jun. 2, 1998

[54] CACHE STATIC RAM HAVING A TEST CIRCUIT THEREIN

[75] Inventor: Jin Kook Choi, Kyoungkido, Rep. of Korea

[73] Assignee: Hyundai Electronics Industries Co., Ltd., Kyoungkido, Rep. of Korea

[21] Appl. No.: 720,201

[22] Filed: Sep. 25, 1996

[30] Foreign Application Priority Data

Sep. 25, 1995 [KR] Rep. of Korea ............. 1995-31716

[51] Int. Cl.$^6$ ............................................. G11C 29/00
[52] U.S. Cl. ................................. 365/201; 371/22.5
[58] Field of Search ........................ 365/201; 371/22.5

[56] References Cited

U.S. PATENT DOCUMENTS

| | | | |
|---|---|---|---|
| 4,575,792 | 3/1986 | Keeley | 395/183.18 |
| 4,686,456 | 8/1987 | Furuyama et al. | 371/21.5 |
| 5,276,833 | 1/1994 | Auvinen et al. | 395/432 |
| 5,444,661 | 8/1995 | Matsui | 365/201 |
| 5,457,696 | 10/1995 | Mori | 371/21.3 |
| 5,619,460 | 4/1997 | Kirihata et al. | 365/201 |

Primary Examiner—Joseph A. Popek
Assistant Examiner—Hoai V. Ho
Attorney, Agent, or Firm—Jacobson, Price, Holman & Stern, PLLC

[57] ABSTRACT

The present invention relates to a cache Static Random Access Memory, and includes an SRAM cell array unit having a 4 way×64 set cell array structure; a write circuit unit for renewing one bit line of 4 way×64 set SRAM cell array after receiving a read way selection signal(tRway) applied from a cache controller, and an address applied from a memory management unit, a pre-charge unit for charging a bit line of SRAM cell array unit to a logic high state; a word line decoder unit for selecting one row of 64 rows of an SRAM cell array unit; a sense amplifier unit for amplifying a weak signal which is, via a bit line, read from a cell of a row selected by the word line decoder unit; a comparator unit for outputting a signal(Taghit#0) by comparing an address applied from the write circuit unit with an output of the sense amplifier unit; and a test circuit for calculating and then outputting a node(AA) value. which is used for determine as to whether or not an SRAM cell is normal according to two signals Dphi1b and Phi2 after receiving data read from the SRAM cell array via the sense amplifier unit and a read way selection signal(tRway) applied from a cache controller.

8 Claims, 3 Drawing Sheets

140

CACHE STATIC RAM HAVING A TEST CIRCUIT THEREIN

BACKGROUND OF THE INVENTION

1. Field of the Invention

The present invention relates to a cache Static Random Access Memory (hereinafter, referred to as SRAM) whose cell array structure is 4 way×64 set, and particularly to a cache SRAM having a test circuit therein, which enables the read/write operation of each SRAM cell to be tested within a cache SRAM.

2. Description of Prior Art

Small-size SRAMs have been used for a high-performance chip such as a microprocessor. Also, a circuit for testing an SRAM is installed outside an SRAM itself.

Therefore, it takes lots of time and expense to test each SRAM cell.

SUMMARY OF THE INVENTION

Accordingly, the present invention is intended to deal with the foregoing problems, and its object is to provide a cache SRAM having a test circuit by installing a test circuit, which is able to read and write each SRAM cell for itself, within a 4 way×64 set SRAM, resulting in a high-speed test and a less complex test of each SRAM cell.

In accordance with one aspect of the present invention, the present invention includes:

an SRAM cell array unit having a 4 way×64 set cell array structure;

a write circuit unit for renewing one bit line of a 4 way×64 set SRAM cell array after receiving a read way selection signal(tRway) applied from a cache controller, and an address applied from a memory management unit;

a pre-charge unit for charging a bit line of an SRAM cell array unit to a logically high state;

a word line decoder unit for selecting one of the 64 rows of an SRAM cell array unit;

a sense amplifier unit for amplifying a weak signal which is via a bit line, read from a cell of a row selected by the word line decoder unit;

a comparator unit for outputting a signal Taghit#0 by comparing an address applied from the write circuit unit with an output of the sense amplifier unit; and a test circuit unit for calculating and then outputting a mode(AA) value, which is used for determining as to whether or not an SRAM cell is normal according to two signals Dphi1b and Phi2 after receiving data read from the SRAM cell array via the sense amplifier unit a read way selection signal(tRway) applied from a cache controller.

A further understanding of the nature and advantages of the present invention may be realized by reference to the remaining portions of the specification and the attached drawings.

DETAILED DESCRIPTION OF THE PREFERRED EMBODIMENT

The present invention will be described with reference to the preferred embodiment illustrated in the accompanying drawings.

Figure 1:
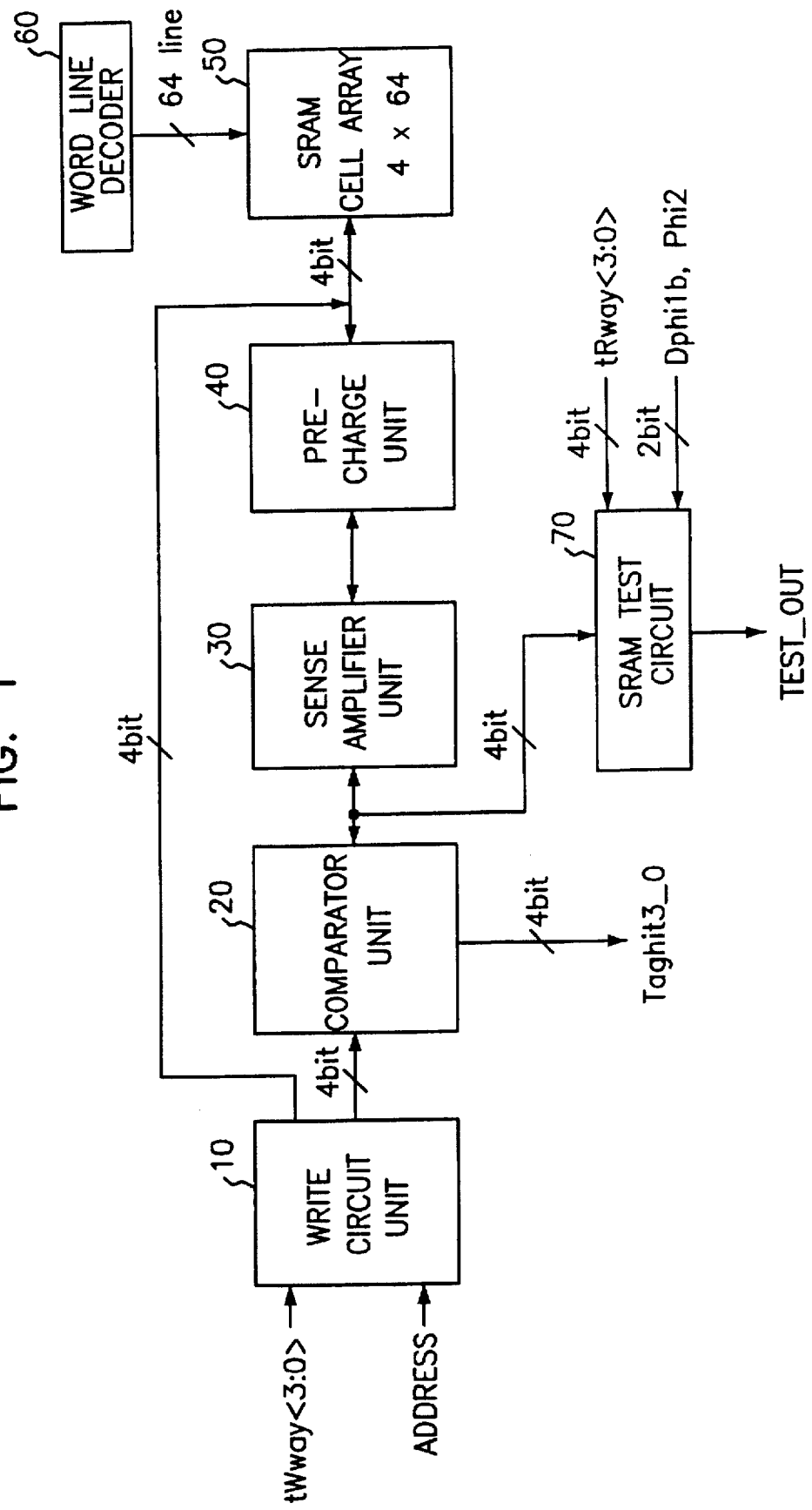
FIG. 1 is a block diagram of a cache SRAM having a test circuit in accordance with the present invention.

FIG. 1 is a block diagram of a read/write circuit of a 4 way×64 set SRAM having a test circuit.

Referring to FIG. 1, a read/write circuit of a 4 way×64 set SRAM includes a write circuit 10, a comparator 20, a sense amplifier 30, a pre-charge unit 40, an SRAM cell array 50, a word line decoder 60, and an SRAM test circuit 70.

The write circuit 10 is used for selecting one bit line of the 4 way×64 set SRAM cell array 50 after receiving the read way selection signal tRway applied from a cache controller (not shown in the drawing) and an address applied from a memory management unit (not shown in the drawings).

The comparator 20 is used for outputting a signal Taghit #_0 by comparing an address applied from the write circuit 10 with an output of the sense amplifier 30.

The sense amplifier 30 is used for amplifying a weal signal which is, via a bit line, read from a cell selected by the word line decoder 60, and then outputting the amplified signal to both the comparator 20 and the SRAM test circuit 70.

The pre-charge unit 40 is responsible for charging a bit line of the SRAM cell array 50 to a logic high state.

The SRAM cell array 50 has a 4 way×64 set cell array structure. The word line decoder 60 is used for selecting one of the 64 rows of the SRAM cell array 50.

Finally, the SRAM test circuit 70 is used for calculating and then outputting a value (node AA in FIG. 1) which is used for determining as to whether or not the SRAM cell is normal according to two signals Dphi1b and Phi2, after receiving data read from the SRAM cell array 50 via the sense amplifier, a read way selection signal(tRway) applied from a cache controller.

Figure 2:
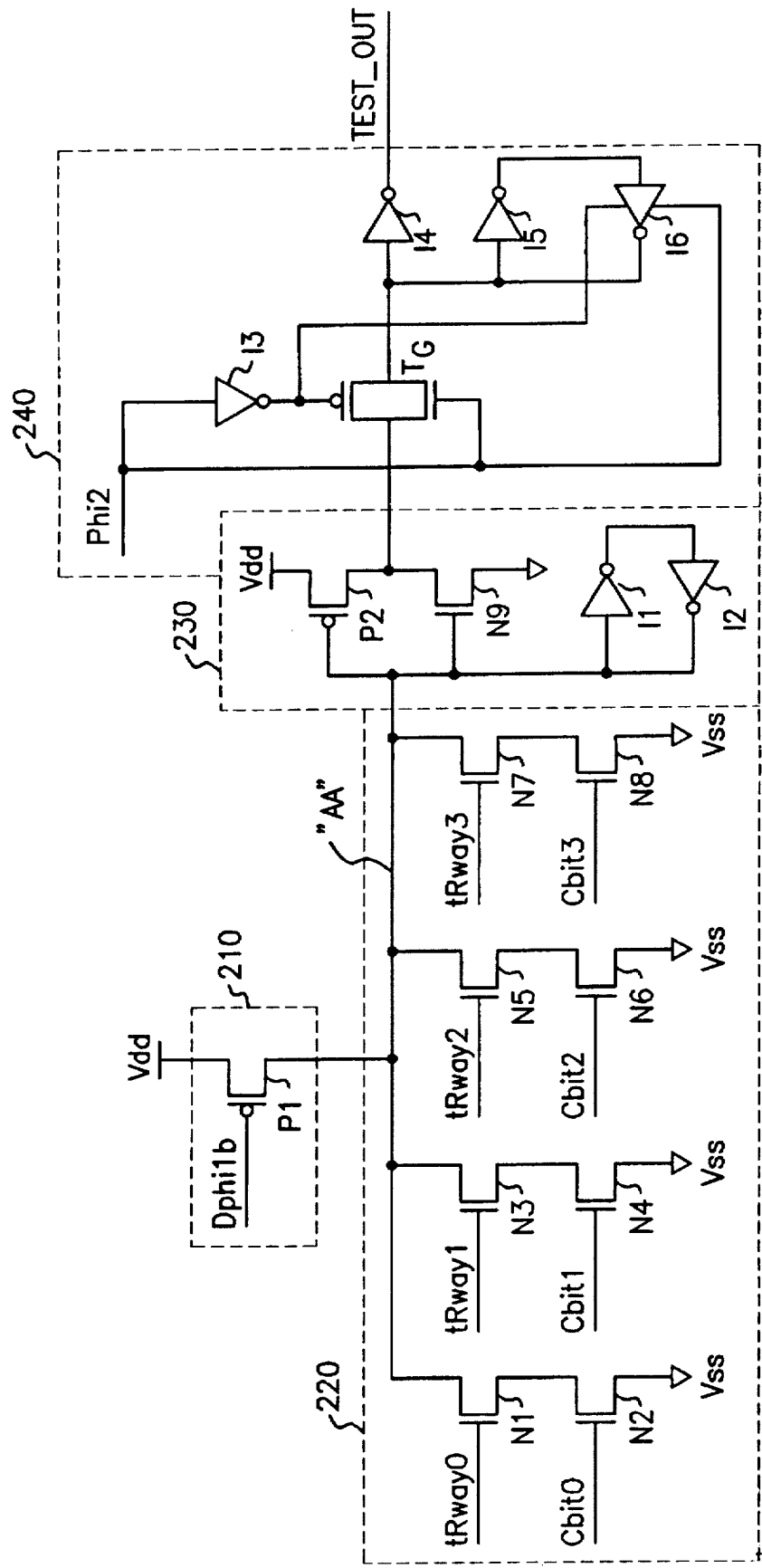
FIG. 2 is a circuit diagram of an SRAM test circuit installed within the cache SRAM of FIG. 1.

FIG. 2 is a detailed circuit diagram of the SRAM test circuit installed within the cache SRAM of FIG. 1.

Referring to FIG. 2, the SRAM test circuit includes:

a pre-charge unit 210 for enabling a node AA to be pre-charged after receiving the signal Dphi1b in phase 1;

a unit 220 for determining a value of a node AA after receiving the read way selection signals tRway0–tRway3 applied from the cache controller and data Cbit0–Cbit 3 which are read from the sense amplifier 30;

an inversion unit 230 for inverting the output of the calculation unit 220; and an output unit 240 for serially transmitting the output of the inversion unit 230 to an output port TEST_OUT in phase 2.

The pre-charge unit 210 is composed of a P-type MOS transistor P1, which is driven by the signal Dphi1b applied into a gate thereof. The P-type MOS transistor P1 is a small-size pull-up transistor.

In addition, unit 220 includes:

a first part for evaluating a value of a node AA after receiving the read way selection signal tRway0 applied from the cache controller and the data Cbit0 which is read from the sense amplifier 30;

a second part for evaluating a value of a node AA after receiving the read way selection signal tRway1 applied from the cache controller and the data Cbit1 which is read from the sense amplifier 30;

a third part for evaluating a value of a node AA after receiving the read way selection signal tRway2 applied from the cache controller and the data Cbit2 which is read from the sense amplifier 30; and a fourth part for evaluating a value of a node AA after receiving the read way selection signal tRway3 applied from the cache controller and the data Cbit0 which is read from the sense amplifier 30.

Furthermore, the first part is composed of a first N-type MOS transistor N1 and a second N-type MOS transistor N2, wherein the read way selection signal tRway0 from the cache controller is applied into the gate of the first N-type MOS transistor N1, and the data Cbit0, which is read from the sense amplifier 30, is applied into the gate of the second N-type MOS transistor N2.

Also, the second part is composed of a third N-type MOS transistor N3 and a fourth N-type MOS transistor N4, wherein the read way selection signal tRway1 from the cache controller is applied into the gate of the third N-type MOS transistor N3, and the data Cbit1, which is read from the sense amplifier 30, is applied into the gate of the fourth N-type MOS transistor N4.

In addition, the third part is composed of a fifth N-type MOS transistor N5 and a sixth N-type MOS transistor N6, wherein the read way selection signal tRway2 from the cache controller is applied into the gate of the fifth N-type MOS transistor N5, and the data Cbit2, which is read from the sense amplifier 30, is applied into the gate of the sixth N-type MOS transistor N6.

Finally, the fourth part is composed of a seventh N-type MOS transistor N7 and an eight N-type MOS transistor N8, wherein the read way selection signal tRway3 from the cache controller is applied into the gate of the seventh N-type MOS transistor N7, and the data Cbit3, which is read from the sense amplifier 30, is applied into the gate of the eight N-type MOS transistor N8.

The inversion unit 230 includes a CMOS transistor including a P-type MOS transistor P2 and an N-type MOS transistor N9 whose gates receive an output of the unit 220, respectively, and also includes a first inverter I1 and a second inverter I2 for latching an output of the unit 220.

Meanwhile, the output unit 240 includes:

an inverter I3 for inverting a signal Phi2;

a transmission gate TG, which is driven by both a signal Phi2 and its inverted signal, for transmitting an output of the inversion unit 230;

an inverter I4 for inverting the signal, which is passed through the transmission gate TG in order to transmit an output of the inversion unit 230 into the output port TEST_OUT; and inverters I5 and I16 for latching an output of the transmission on gate TG.

Referring again to FIG. 1, the word line decoder 60 selects one of 64 rows of the 4 way×64 set SRAM cell array 50, and the write circuit 10 sends its output to one bit line of the 4 way×64 set SRAM cell array 50 after receiving both the read way selection signal tRway applied from a cache controller and an address applied from a memory management unit. At this time, only one bit line corresponding to one column is selected because one signal of all the read way selection signals tRway0–tRway3 is enabled.

The pre-charge unit 40 charges a bit line up to a logic high state, and the word line decoder 60 selects one of 64 rows, and then a cell value of a 4 way×64 set SRAM cell array 50, corresponding to the selected row, is read through a bit line.

At this time, the sense amplifier 30 amplifies a weak signal from the bit line, and then outputs the amplified signal to both the comparator 20 and the SRAM test circuit 70.

The comparator 20 is used for outputting a signal Taghit3_0 of 4 bits, by comparing an address applied from the write circuit 10 with an output of the sense amplifier 30.

Figure 3:
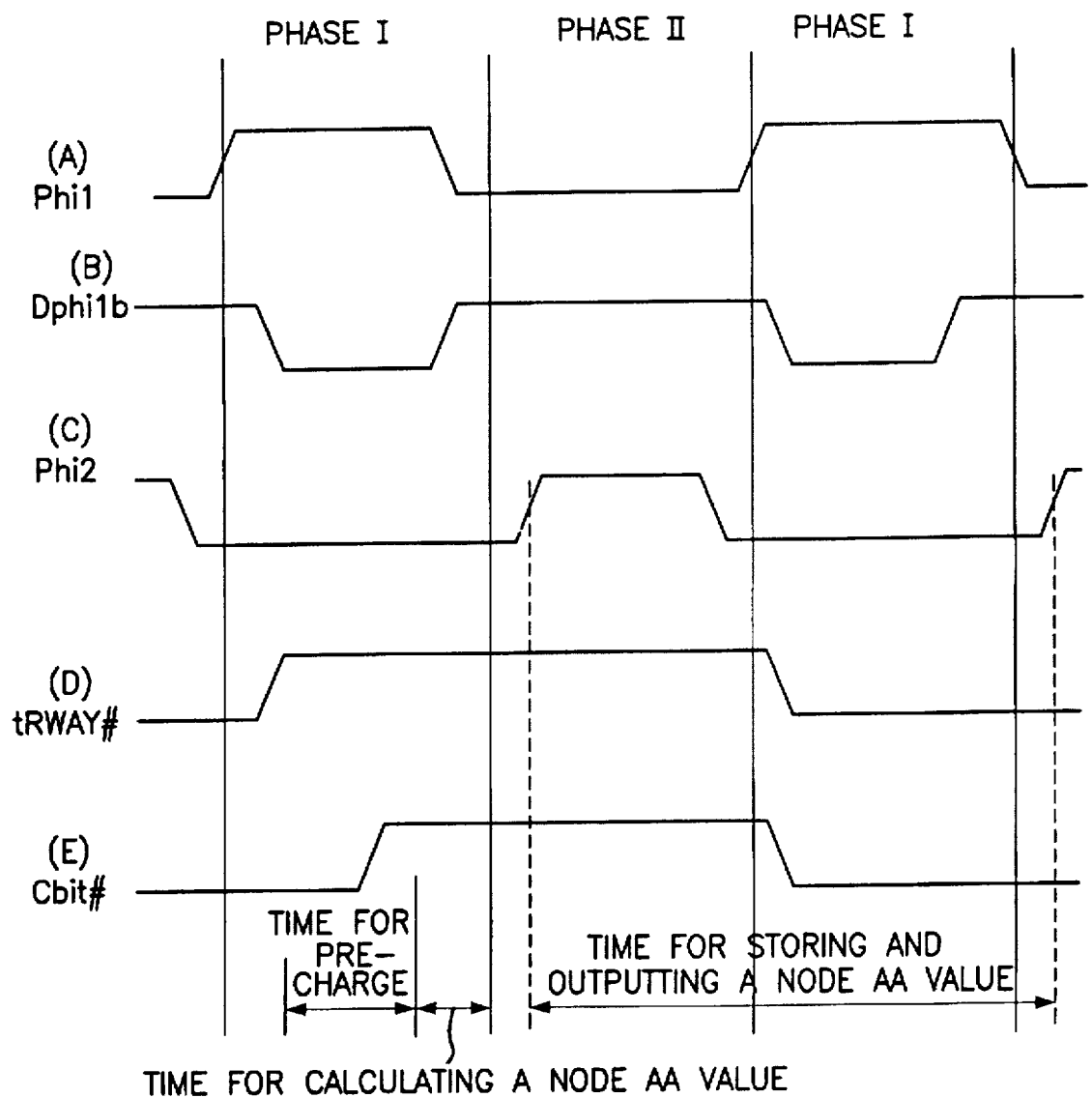
FIG. 3 is a timing chart of an operation of the SRAM test circuit of FIG. 2.

Referring to FIG. 2 and FIG. 3, the operation of the SRAM test circuit 70 will be described in detail.

As shown in FIG. 3 (A), in phase 1, a signal Dphi1b becomes a logical low state. This low state signal is applied to the gate of the P-type MOS transistor P1 of the pre-charge unit 210, thus the P-type MOS transistor P1 is turned on.

Accordingly, the node AA is charged to a logical high state, and the value of the node AA is determined by the unit 220.

As a result of the read operation, the data Cbit0–Cbit3 read from RAM cell, as shown in FIG. 3 (E), are amplified by the sense amplifier 30, and then applied to the gate of the N-type MOS transistors N2, N4, N6 and N8, respectively.

Also, the read way selection signals tWway0–tWway3 applied from the cache controller, as shown in FIG. 3 (D), are applied to the gate of the N-type MOS transistors N1, N3, N5 and N7, respectively.

At this time, only one of the signals tWway 0 to tWway 3 from the cache controller is in a high level. In case the signal tWway 0 is in a high level and the signals tWway 1 to tWway 3 are in a low level, the output (node AA) of the unit 220 is determined by the data Cbit 0. Accordingly, the logic state of the data Cbit 0 may be expressed as the output of the unit 220. In such a manner, the logic state of each of the data Cbit 0 to Cbit 3 is determined by the output of the unit 220.

As stated above, after determining a value of 4 bit SRAM cell corresponding to each way in the phase 1, the determined value at a node AA is serially outputted and sequentially applied to the inversion part 230, and then applied to the output unit 240.

Accordingly, as shown in FIG. 3 (C), the signal Phi2 becomes logically high in phase 2, which drives the transmission gate TG, such that the output of the inversion unit 230 is applied to the inverter I4. Thus, the inverter I4 inverts the output of the inversion unit 230, and the original value of the 4 bits SRAM cell is serially outputted to the output port TEST_OUT.

Therefore, the microprocessor stores in a buffer the value which is outputted from the output port TEST_OUT, and after "value", compares the value, which is originally written on an SRAM cell, with the shared value in the offer microprocessor can determine that the operation of an SRAM is normal if the above values are equal, or the the operation of an SRAM is abnormal if the above values are different.

As mentioned above, the present invention can determine as so whether or not the operation of the SRAM cell is normal by comparing the value from the read operation of the SRAM cell with the initial value of a write operation.

Therefore, the present invention makes it much easier to test an SRAM cell, and further it makes the chip size smaller. Also, according to the present invention, it takes much less time and expense.

What is claimed:

1. A cache SRAM having a test circuit therein, comprising:

an SRAM cell array having a plurality of memory blocks;

a write circuit means for selecting one bit line of said memory block after receiving a read way selection signal applied from a cache controller and an address applied from a memory management unit;

a pre-charge means for charging the selected bit line to a logic high state;

a word line decoding means for selecting one memory cell in said memory block;

a sense amplifier for amplifying a weak signal which is, via the bit line, read from the cell selected by said word line decoding means;

a comparating means for outputting a tag bit signal by comparing an address applied from said write circuit means with an output of said sense amplifier; and a test circuit means for determining as to whether or not said selected cell is normal according to a first control signal and a second control signal after receiving data read from said selected cell via said sense amplifier and said read way selection signal applied from the cache controller.

2. The cache SRAM having a test circuit therein in accordance with claim 1, wherein said test circuit means comprises:

a pre-charge unit for precharging a node to be pre-charged after receiving the first control signal;

an evaluation means for evaluating the node AA value after receiving read way selection signals applied from the cache controller and data signals which are read from said sense amplifier;

an inversion means for inverting an output of said evaluation means; and an output unit for serially transmitting an output of said inversion means to an output port.

3. The cache SRAM having a test circuit therein in accordance with claim 2, wherein said pre-charge unit is composed of a P-type MOS transistor P1 for a pull-up transistor, which is driven by the signal Dphi1b applied into a gate thereof.

4. The cache SRAM having a test circuit therein in accordance with claim 2, wherein said inversion means comprises:

a CMOS transistor composed of a P-type MOS transistor and an N-type MOS transistor whose gate receive the output of said evaluation means, respectively; and a first inverter and a second inverter for latching the output of said evaluation means.

5. The cache SRAM having a test circuit therein in accordance with claim 2, wherein said output unit comprises:

a third inverter for inverting the second control signal;

a transmission gate, which is driven by both the second control signal and its inverted signal, for transmitting the output of said inversion means;

a fourth inverter for inverting the signal which is passed through said transmission gate in order to transmit the output of said inversion means into the output port; and a fifth inverter and a sixth inverter for latching the output of said inversion means.

6. The cache SRAM having a test circuit therein in accordance with claim 2, wherein said evaluation means comprises:

a plurality of current pass means coupled in parallel to the node, each of said current pass means passing a pre-charged high voltage to a ground voltage level in response to the read way selection signal and the data signals form said selected cell.

7. The cache SRAM having a test circuit therein in accordance with claim 6, wherein said current pass means comprises:

a first switching transistor coupled to the node, being turned on in response to the read selection signal; and a second switching transistor coupled in series to said first switching transistor, being turned on in response to the data signals from said selected cell.

8. The cache SRAM having a test circuit therein in accordance with claim 6, wherein the number of said current pass means is same as that of bits of said SRAM.

* * * * *